United States Patent
Wang et al.

(10) Patent No.: US 7,069,737 B2
(45) Date of Patent: Jul. 4, 2006

(54) WATER-COOLING HEAT DISSIPATION SYSTEM

(75) Inventors: Jack Wang, No. 2, Ta-Chih Rd., Taoyuan City 330 (TW); Cheng-Hua Cheng, Taoyuan (TW); Michael Lin, Taoyuan (TW); Charles Ma, Taoyuan (TW)

(73) Assignees: Waffer Technology Corp., Taoyuan (TW); Jack Wang, Taoyuan (TW)

( * ) Notice: Subject to any disclaimer, the term of this patent is extended or adjusted under 35 U.S.C. 154(b) by 163 days.

(21) Appl. No.: 10/827,277

(22) Filed: Apr. 20, 2004

(65) Prior Publication Data

US 2005/0230086 A1    Oct. 20, 2005

(51) Int. Cl.
   *F25D 23/12*    (2006.01)

(52) U.S. Cl. ..................................... 62/259.2; 361/676
(58) Field of Classification Search .................... 62/64, 62/259.2, 314, 375, 376, 419; 165/80.4; 361/676, 688, 689, 698
See application file for complete search history.

(56) References Cited

U.S. PATENT DOCUMENTS

| 5,349,831 A * | 9/1994 | Daikoku et al. ............... 62/376 |
| 5,469,711 A * | 11/1995 | McCoy ....................... 62/51.1 |
| 5,471,850 A * | 12/1995 | Cowans ........................ 62/223 |
| 5,655,375 A * | 8/1997 | Ju ................................. 62/3.6 |
| 6,166,907 A * | 12/2000 | Chien ......................... 361/699 |
| 6,542,370 B1 * | 4/2003 | Wang et al. ................. 361/704 |
| 6,543,246 B1 * | 4/2003 | Wayburn et al. ........... 62/259.2 |
| 6,567,262 B1 * | 5/2003 | Meir ........................... 361/676 |
| 6,698,500 B1 * | 3/2004 | Noda et al. ................ 165/80.3 |
| 2005/0083647 A1 * | 4/2005 | Neho et al. ................. 361/687 |

FOREIGN PATENT DOCUMENTS

JP    11-179946 A  *  7/1999

* cited by examiner

*Primary Examiner*—Mohammad M. Ali

(57) ABSTRACT

A water-cooling heat dissipation system includes a heat sink mounted on a heat generating electronic device and a circulating loop connected to two ends of the heat sink. The circulating loop has a water pump attached at the inlet of the heat sink, a first cooling base attached at the outlet of the heat sink, and a second cooling base between the water pump and the heat sink. The second cooling base has a cryogenic chip to provide icy water to the heat sink, such that heat dissipation efficiency is greatly enhanced.

7 Claims, 2 Drawing Sheets

WATER-COOLING HEAT DISSIPATION SYSTEM

BACKGROUND OF THE INVENTION

The present invention relates in general to a water-cooling heat dissipation system, and more particularly, to the water-cooling heat dissipation system applied to a heat-generating device such as a central processing unit (CPU).

Figure 1:
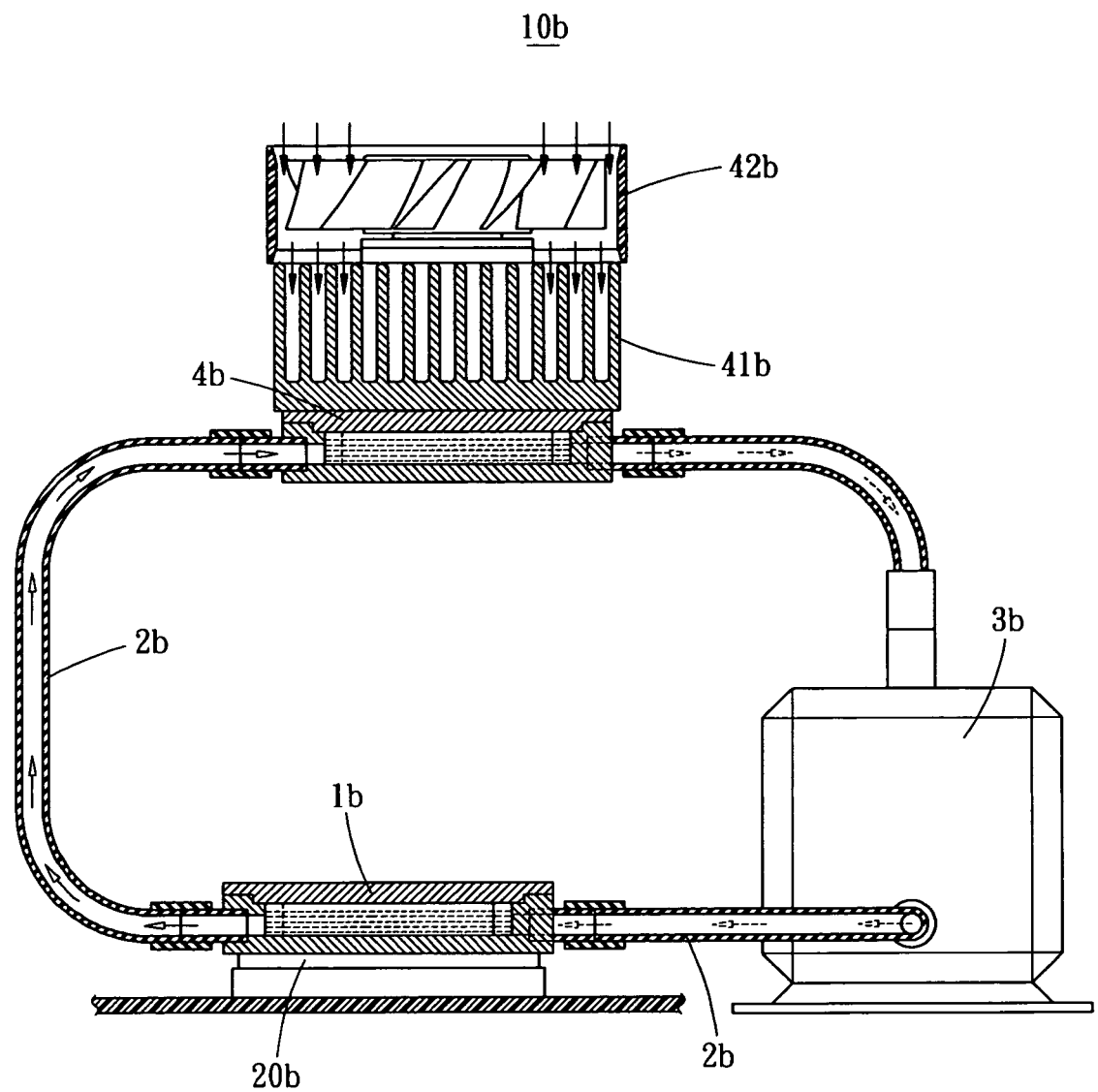

FIG. 1 shows a conventional heat dissipation system 10b used for a CPU. As shown, the heat dissipation system 10b includes a heat sink 1b mounted on a CPU 20b, circulating pipes 2b connected to two ends of the heat sink 1b, a water pump 3b attached to the circulating pipe 2b at the inlet of the heat sink 1b, and a cooling base 4b installed at the circulation pipe 2b at the outlet of the heat sink 1b. In application, cold water is fed into the heat sink 1b from the water pump 3b. After heat exchange, the cold water is heated into hot water to flow out of the heat sink 1b. Through the circulating pipe 2b, the hot water which flows into the cooling base 4b is cooled down by another heat exchange. Thereby, the cold water then flows back to the water pump 3b to continuously perform circulation type of heat exchange. However, in this type of water-cooling heat dissipation system 10b, the water flows into the heat sink 1b is only cold water of which the temperature is not low enough to efficiently dissipate heat generated by high speed CPU 20b.

There is thus a substantially need to develop a water-cooling heat dissipation system to efficiently dissipate heat generated by a high-operation electronic device.

SUMMARY OF THE INVENTION

The present invention provides a water-cooling heat dissipation system which cools down the warm water into icy water before flowing into the heat sink to perform heat exchange. Thereby, the heat dissipation efficiency is greatly enhanced.

The present invention further provides a water-cooling heat dissipation system which does not impellently dissipate heat generated from an electronic device, such that the lifetime of the electronic device is prolonged.

The water-cooling heat dissipation system provided by the present invention includes a heat sink mounted to a heat-generating electronic device and a circulating loop connected to two ends of the heat sink. The circulating loop includes a water pump attached at an inlet of the heat sink, a first cooling base attached at an outlet of the heat sink, and a second cooling base between the water pump and the heat sink. The second cooling base includes a cryogenic chip to provide icy water to the heat sink, while the first cooling base is operative to cool down the hot water flowing out of the heat sink. Each of the first and second cooling bases includes a heat sink mounted thereon and a cooling fan mounted on the heat sink.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF ACCOMPANIED DRAWINGS

Figure 2:
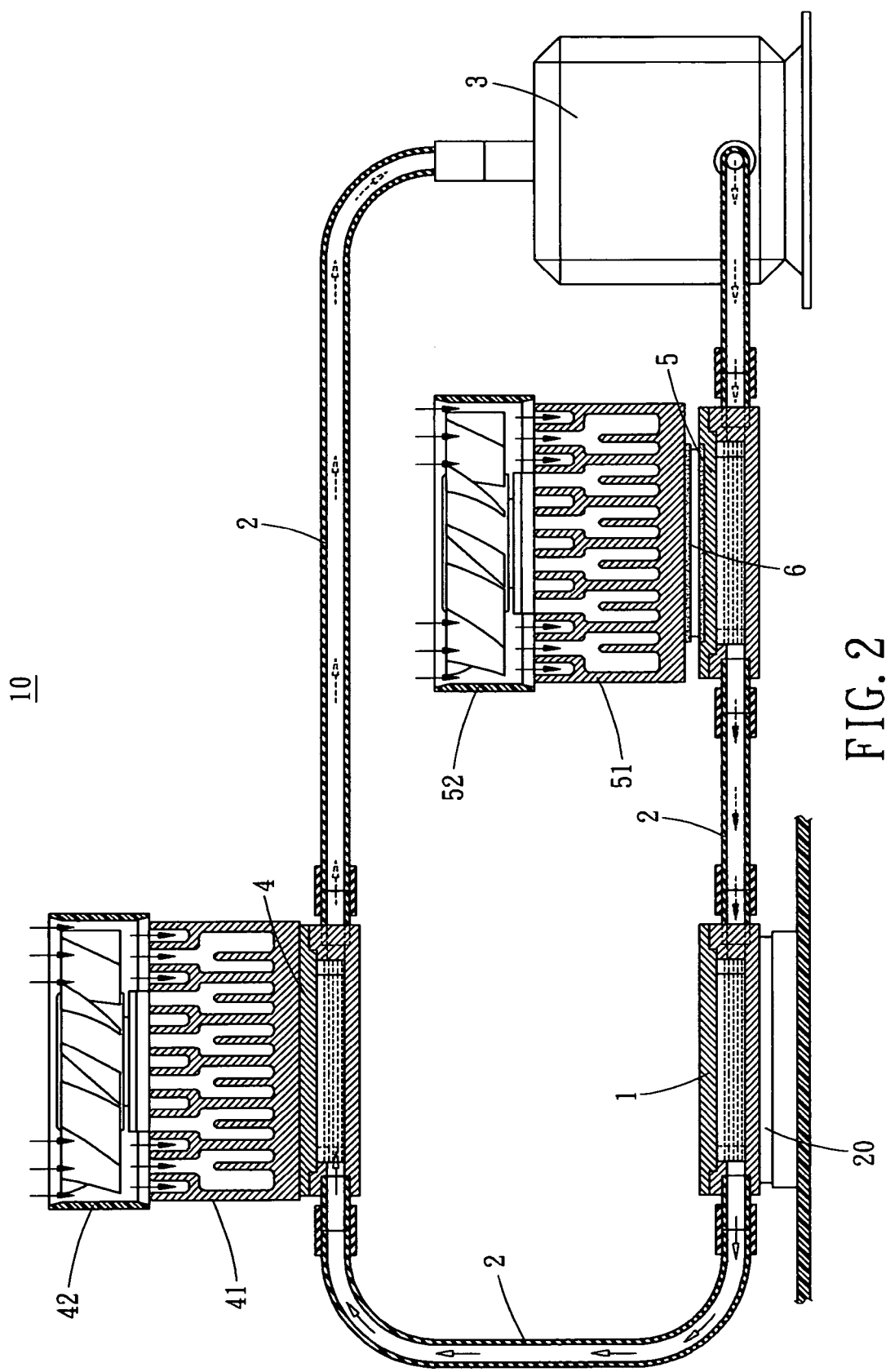

The above objects and advantages of the present invention will be become more apparent by describing in detail exemplary embodiments thereof with reference to the attached drawings in which:

FIG. 1 illustrates a cross sectional view of a conventional water-cooling heat dissipation system; and FIG. 2 shows a cross sectional view of a water-cooling heat dissipation system in one embodiment of the present invention.

DETAILED DESCRIPTION OF EMBODIMENT

Reference will now be made in detail to the preferred embodiments of the present invention, examples of which are illustrated in the accompanying drawings. Wherever possible, the same reference numbers are used in the drawings and the description to refer to the same or like parts.

FIG. 2 shows a water-cooling heat dissipation system 10 applicable to dissipate heat generated by various types of electronic devices such as a central processing unit 20.

The water-cooling heat dissipation system 10 includes a heat sink 1 mounted on the central processing unit 20 and a circulating loop 2 connecting at two ends of the heat sink 1. The circulating loop 2 includes a water pump 3 installed at an inlet of the heat sink 1 and a first cooling base 4 installed at an outlet of the heat sink 1. The first cooling base 4 includes a heat sink 41 and a heat dissipation fan 42 mounted on the heat sink 1. In this embodiment, the heat sink 41 includes an aluminum extrusion type of fins.

As shown in FIG. 2, a cooling base 5 is installed at the circulating loop 2 between the heat sink 1 and the water pump 3. The second cooling base 5 includes a cryogenic chip 6 operative to lower the one surface thereof into a cool end and the other surface thereof into a hot end. The cold end of the cryogenic chip 6 is attached to the second cooling base 5, while the hot end of the cryogenic chip 6 includes a heat sink 51 and a cooling fan 52 on top of the heat sink 51. In this embodiment, the heat sink 51 includes aluminum extrusion type of fins.

In application, cool water is delivered into the circulating pipe 2 from the water pump 3. When the water flows into the second cooling base 5 for heat exchange, the cryogenic chip 6 cools down the water into icy status. The icy water flows into the circulating loop 2 again, while heat generated from the cryogenic chip 6 is dissipated by the heat sink 51 and the cooling fan 52. The icy water then flows into the heat sink 1 to perform heat exchange, so as to absorb heat generated by the central processing unit 20. After the heat exchange, the water is heated into warm or hot water and discharged to the first cooling base 4. Another heat exchange is then performed in the first cooling base 4 to cool the hot water down into cool water. Meanwhile, heat generated by the cooling base 4 is then dissipated by the heat sink 41 and the cooling fan 42. The cool water recycled flows back to the water pump 3 and circulated along the circulation loop 2 again to continuously perform heat dissipation of the central processing unit 20.

According to the above, the heat dissipation system 10 includes a cryogenic member 6 to provides icy water for the heat sink 1, such that heat generated by the central processing unit 20 is efficiently dissipated, and the lifetime of the central processing unit 20 is prolonged.

While the present invention has been particularly shown and described with reference to preferred embodiments thereof, it will be understood by those of ordinary skill in the art the various changes in form and details may be made therein without departing from the spirit and scope of the present invention as defined by the appended claims.

What is claimed is:

1. A water-cooling heat dissipation system used to dissipate heat generated by an electronic device, comprising:
   a heat sink, mounted on the electronic device, the heat sink having a circulating loop connected to two ends of the heat sink;
   a first cooling base installed in the circulating loop at an outlet of the heat sink;
   a second cooling base installed in the circulating loop at an inlet of the heat sink, the second cooling base having a cryogenic chip to cool down water flowing therethrough into icy state; and
   a water pump installed in the ciruclating loop between the first and the second cooling base.

2. The system as claimed in claim 1, wherein the electronic device includes a central processing unit.

3. The system as claimed in claim 1, wherein the first cooling base includes a heat sink mounted thereon and a cooling fan mounted on the heat sink.

4. The system as claimed in claim 1, wherein the heat sink includes an aluminum extrusion type of fins.

5. The system as claimed in claim 1, wherein the cryogenic chip includes a cold surface attached to the second cooling base and a hot surface.

6. The system as claimed in claim 5, wherein the second cooling base further includes a heat sink mounted on the hot surface of the cryogenic chip and a cooling fan attached on the heat sink.

7. The system as claimed in claim 6, wherein the heat sink includes an aluminum extrusion type of fins.

* * * * *